United States Patent [19]

Ozasa

[11] 4,199,688
[45] Apr. 22, 1980

[54] APPARATUS FOR ELECTRON BEAM LITHOGRAPHY

[75] Inventor: Susumu Ozasa, Kashiwa, Japan

[73] Assignee: Hitachi, Ltd., Japan

[21] Appl. No.: 962,768

[22] Filed: Nov. 21, 1978

[30] Foreign Application Priority Data

Nov. 24, 1977 [JP] Japan .................................. 52-139941

[51] Int. Cl.² ............................................. A61K 27/02
[52] U.S. Cl. ................................ 250/492 A; 250/311; 250/397
[58] Field of Search ............................ 250/492 A, 311

[56] References Cited
U.S. PATENT DOCUMENTS 3,576,438  4/1971  Pease ..................................... 250/311

Primary Examiner—Harold A. Dixon
Attorney, Agent, or Firm—Craig and Antonelli

[57] ABSTRACT

An apparatus for electron beam lithography for automatically focusing a shaped electron beam uniformly projects an electron beam onto a reference aperture plate having an opening of a prescribed shape. The electron beam in the shape of the opening of the aperture thus obtained is reduced or concentrated and then projected onto a specimen, to thereby project the specimen as a microscopic pattern. The apparatus periodically changes the direction of the electron beam disposed between an electron gun emitting the electron beam and the reference aperture plate, and detects the deviation of the position of the final-image electron beam corresponding to the angle of deflection of the electron beam. The focal distance of a final-stage electron lens is adjusted so as to minimize positional deviation and thereby focus the projected electron beam.

7 Claims, 10 Drawing Figures

FIG. 1A   FIG. 1B
(1)
(2)
(3)
(4)
(5)
FIG. 2
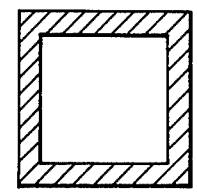
FIG. 3A
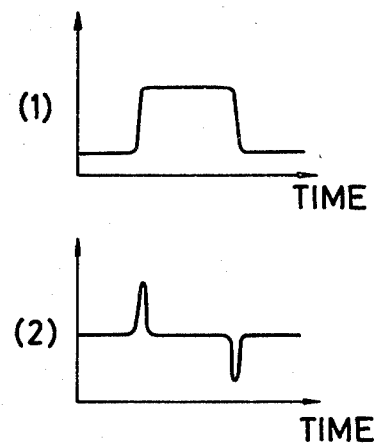
FIG. 3B
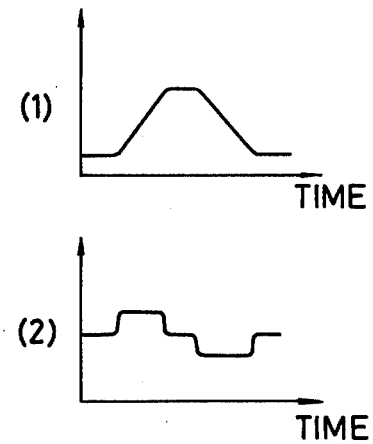

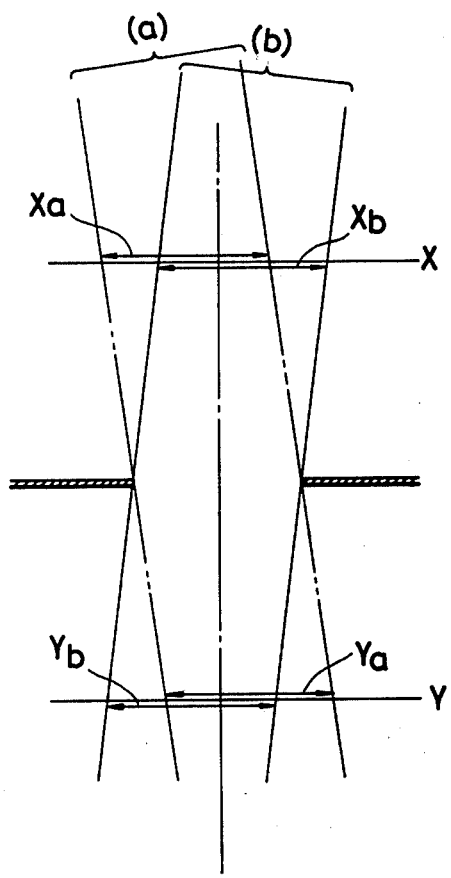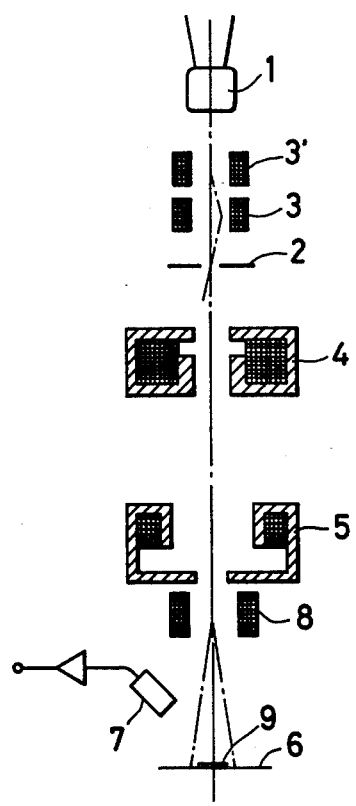

APPARATUS FOR ELECTRON BEAM LITHOGRAPHY

BACKGROUND OF THE INVENTION

This invention relates to improvements in an apparatus for electron beam lithography and more particularly, to an apparatus for electron beam lithography capable of automatic focusing.

The manufacture of an LSI (large scale integration) or IC (integrated circuit) may employ a method wherein an electron beam accelerated to a high velocity is converged to a fine beam by an electron lens system and is simultaneously deflected and scanned in two dimensions by a scanning coil, so as to process the surface of an object into a microscopic pattern. In this case, with respect to the shape of the electron beam which impinges on a specimen such as of electron beam resist, there is a technique in which the image of an electron source is reduced as it is; that is, it is reduced to the size of a spot smaller than the precision of the pattern. Another technique includes uniformly projecting the electron beam onto an aperture plate having an opening (e.g. square or rectangular) and the resultant electron beam in the shape of the opening of the aperture plate is reduced. As compared with the former technique employing the spot beam or point beam, the latter technique has the advantage that since the specimen of a fixed area can be illuminated once, the processing time can be sharply reduced. In the latter technique, however, there are the disadvantages that the electron beam image from the aperture plate must be accurately projected on the specimen and that the detection of defocusing is difficult.

Regarding the conventional spot beam or point beam, the electron beam shape on the job surface, in the case of changing the focal point, varies as illustrated in FIG. 1A. The size of the beam spot becomes the smallest for correct focusing indicated at (3). In FIG. 1A, (1) and (2) illustrate cases of insufficient focus and (4) and (5) illustrate cases of excess focus. Accordingly, where a reference mark having a shape as shown by way of example in FIG. 2 and made of a substance (e.g. gold (Au)) differing in atomic number from the substance of a substrate (e.g. silicon (Si)) is applied on the work surface, where the electron beam is scanned orthogonally to the edge part of the reference mark and where reflected electrons, secondary electrons, or the like, thus generated are detected, an output as illustrated in FIG. 3A is obtained due to the difference of the reflection factors of the substrate and the mark for the electrons. Thus, correct focusing is indicated by the condition for which the gradient of an output waveform (1) becomes the most abrupt, that is, for which a waveform (2) for the differentiated values of the output waveform becomes the highest.

On the other hand, for a shaped beam having a square-like cross-section, the beam cross-section for changes in the focal point varies as illustrated at (1) to (5) in FIG. 1B. The beam size does not become the smallest at a correct focusing depicted at (3) in the Figure. Accordingly, an output waveform (1) obtained by scanning the edge part of the reference mark 2, as shown by way of example in FIG. 2, and a differentiated waveform (2) thereof become as in FIG. 3B. It is extremely difficult to know the condition of the correct focusing from these output waveforms. (1) and (2) in FIG. 1B illustrate cases of insufficient focus and (4) and (5) illustrate cases of excess focus.

SUMMARY OF THE INVENTION

The invention has been made in view of the drawbacks described above, and has as an object the provision of an apparatus for electron beam lithography which makes possible the focusing of a shaped beam, especially the automation thereof.

In order to accomplish the above-mentioned object, according to the invention, electron beam-deflecting means is disposed between an electron gun and a reference aperture plate, the deviation of the position of a final-image electron beam corresponding to the angle of deflection of the electron beam by the deflection means is detected, and the focal distance of a final-stage electron lens is adjusted so as to minimize the positional deviation.

BRIEF DESCRIPTION OF THE DRAWINGS

FIGS. 1A and 1B are sectional views of a spot electron beam and a shaped electron beam, respectively;

FIG. 2 is a view showing a reference mark;

FIGS. 3A and 3B are diagrams showing detection signals from the reference mark in the cases of the spot beam and the shaped beam, respectively;

FIG. 4 is a diagram for explaining the principle of the invention;

FIG. 5 is a view showing an embodiment of the invention;

DETAILED DESCRIPTION OF THE PREFERRED EMBODIMENTS

Figure 6:
FIG. 6 is a diagram showing scanned images of a reference mark.

Hereunder, the invention will be described with reference to the drawings.

FIG. 4 is a diagram for elucidating the principle of the invention and shows a shaping portion of an electron beam.

Where a lower-stage lens system is properly focusing the beam, an aperture plate is projected onto a work surface. However, for insufficient focusing, a plane X may be projected and for excess focusing a plane Y may be projected. Where the direction of electron beam impingement on the aperture plate varies, a part Xa is projected on the work surface at an impingement direction (a) and a part Xb at an impingement direction (b) for insufficient focusing. A part Ya is projected on the work surface at the impingement direction (a) and a part Yb is projected on the work surface at the impingement direction (b) for excess focusing. That is, in the presence of defocusing, the position of the projected beam shifts due to a change in the direction of the illuminated electron beam and the quantity of the shift is proportional to the degree of defocusing and the degree of change in the direction of the emitted electron beam. The directions of the shifts are opposite one another between insufficient focusing and excess focusing.

FIG. 5 shows an embodiment of the invention wherein numeral 1 designates an electron gun and numeral 2 designates an aperture plate. Numerals 3 and 3' designate deflectors for changing the direction of an illuminated electron beam. Numeral 4 indicates a reduction lens, numeral 5 an objective lens or projection lens, and numeral 6 the work surface of a specimen (wafer or mask). Numeral 7 represents a detector for reflected electrons or secondary electrons. Shown at 8 is a beam scanning deflector for scanning the electron beam on the work surface. Numeral 9 denotes a reference mark which is formed on the work surface 6.

With the illustrated construction, the scanning image of the reference mark 9 as shown in FIG. 2 is observed and, simultaneously, the deflectors 3 and 3' are operated to periodically change the direction of the emitted electron beam. Then, in the case of defocusing, the image of the edge of the reference mark in the scanning image becomes as shown at (a) in FIG. 6. Where a correct focus has been reached by the focusing control, an image having no fluctuation as shown at (b) in FIG. 6 is attained. That is, proper focusing is achieved by detecting the deviation of the position of the final-image electron beam corresponding to the angle of deflection of the electron beam by the deflection coils 3 and 3' and by adjusting the focal distance of the final-stage lens 5 so as to minimize the positional deviation.

While, in the above description, a method of detecting the focus by the visual observation has been presented, an electrical method of detection will be described below.

Figure 8:
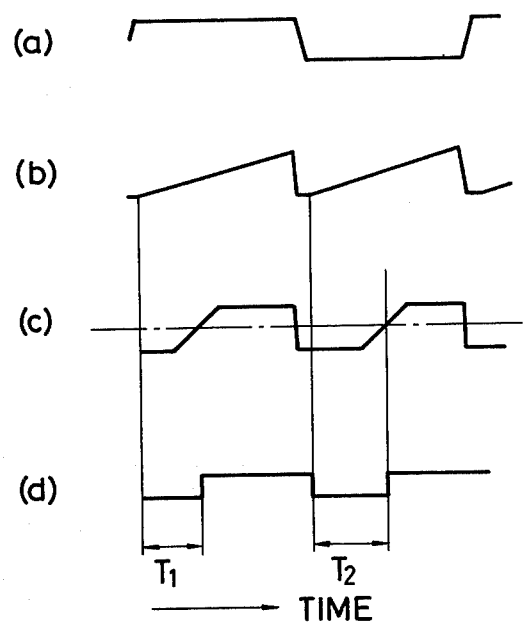
FIG. 8 is a diagram showing waveforms versus time in various portions in FIG. 7.
Figure 7:
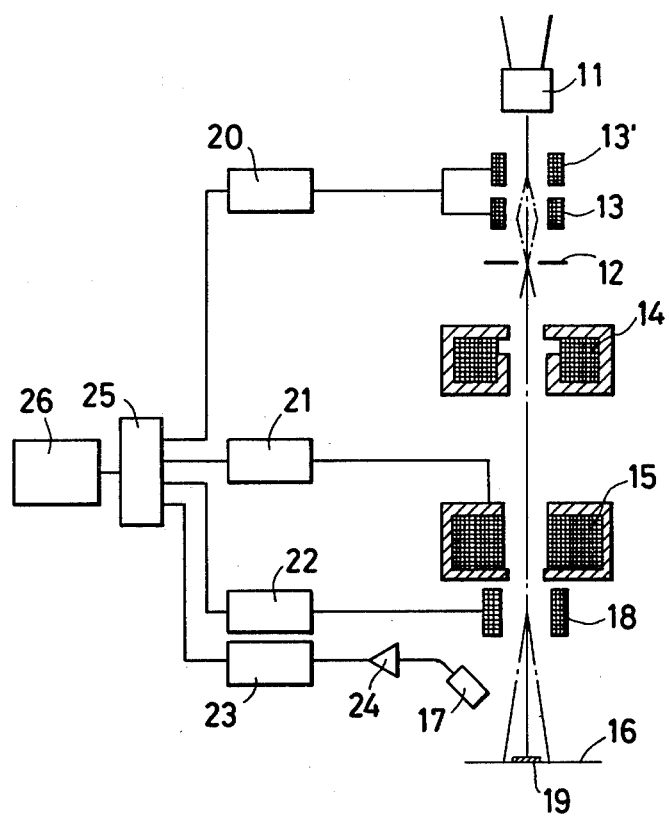
FIG. 7 is a view showing another embodiment of the invention.

FIG. 7 shows another embodiment of the invention. In the Figure, reference numerals 11 through 19 designate the same components as indicated by reference numerals 1 through 9 in FIG. 5, respectively. Numeral 20 denotes a deflecting power source for the deflectors 13 and 13', numeral 21 a focus correcting power source for adjusting the focal length of the final-stage lens 15, and numeral 22 a deflecting power source for the beam scanning deflector 18 serving to scan the electron beam on the work surface 16. Numeral 23 represents a counter, numeral 24 an amplifier, numeral 25 an interface device, and numeral 26 a control device (for example, an electronic computer). With such a construction, a current having a waveform as shown at (a) in FIG. 8 is applied to the deflectors 13 and 13' and a current having a waveform as shown at (b) in FIG. 8 is caused to flow through the beam scanning deflector 18 to periodically change the direction of the electron beam so as to locate the edge of the reference mark 19 in the scanning range of the electron beam. These operational signals are stored in the control device 26 in advance. Assuming that the output of the detector 17 thus obtained is as shown at (c) in FIG. 8, then the periods of time $T_1$ and $T_2$, during which the detection output waveform passes through a fixed level at (d) in FIG. 8, indicate the relative positions of the beam and the reference mark edge. Accordingly, $\Delta T = T_1 - T_2$ is proportional to the quantity of defocusing, and the sign of $\Delta T$ represents the direction of the defocusing. In this case, the periods of time $T_1$ and $T_2$ are measured by the counter 23. They are entered into the control device 26 in which $\Delta T$ is evaluated. Accordingly, a correct focus can be automatically realized by measuring $\Delta T$, correcting the exciting current or focal length of the projection lens 15 in proportion to the value thereof, and feed back a control signal so as to establish $\Delta T = 0$.

The deflecting means according to the invention for periodically changing the angle of deflection of the illuminated electron beam is not restricted to the two deflection coils (3 and 3' or 13 and 13'), as exemplified in each of the foregoing embodiments, but the focusing in the present invention is possible even when the electron beam is deflected with a single deflection coil by exploiting the fact that the electron beam is usually emitted radially from the electron gun. The invention is not restricted to a magnetic field type deflection coil employed in the foregoing embodiments, but an electrostatic type deflector (ordeflection plate) is of course applicable in the embodiments described above. Further, the electron beam need not have its angle of deflection periodically changed symmetrically with respect to an optical axis, but it is only required that the difference $\Delta T$ be measured by periodically changing the angle of deflection.

As set forth above, according to the invention, defocusing can be converted into a lateral movement of an image by deflecting an electron beam which impinges on an aperture plate, so that the defocusing can be accurately detected by detecting information representative of the position of the electron beam on a work surface. Moreover, the direction of the deviation of the electron beam indicates the direction of excess or insufficiency in the focusing control so that automation of the focusing control can be achieved very easily.

While I have shown and described several embodiments in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed:

1. In an apparatus for electron beam lithography, wherein an electron beam is uniformly projected onto a reference aperture plate having an opening of a prescribed shape and has a cross-sectional shape of the opening of the aperture plate, and is concentrated and then projected onto a specimen, to thereby process a microscopic pattern in the specimen;

an apparatus for electron beam lithography comprising:

electron beam-deflecting means for periodically changing the direction of travel of the electron beam disposed between an electron gun emitting said electron beam and said reference aperture plate;

means for detecting the deviation of the position of the final-image electron beam corresponding to the angle of deflection of the electron beam caused by said electron beam-deflecting means; and means for adjusting the focal length of a final-stage electron lens, so as to minimize positional deviation of said beam and thereby focus the projected electron beam.

2. An apparatus for electron beam lithography according to claim 1, wherein said electron beam-deflecting means comprises two deflection coils which have their respective deflection centers disposed at different positions along a prescribed optical axis.

3. An apparatus for electron beam lithography according to claim 1, wherein said electron beam-deflecting means comprises a single deflection coil.

4. An apparatus for electron beam lithography according to claim 1, wherein said electron beam-deflecting means comprises two electrostatic deflectors which have their respective deflection centers located at different positions along a prescribed optical axis.

5. An apparatus for electron beam lithography according to claim 1, wherein said electron beam-deflecting means comprises a single electrostatic deflector.

6. An apparatus for electron beam lithography according to claim 1, wherein said adjusting means includes means for automatically causing proper focusing of the projected electron beam by measuring the period of time during which a detection output from the detecting means exceeds a predetermined threshold level and for evaluating the degree and direction of defocusing of said projected electron beam;
   means for correcting an exciting current of said final stage lens on the basis of said degree and direction; and
   means for feeding back a control signal to said lens, so as to minimize defocusing.

7. An apparatus for electron beam lithography according to claim 1, wherein a reference mark is disposed on a surface of the specimen within the scanning range of the projected electron beam.

* * * * *